US00RE41496E

(19) United States
(12) Reissued Patent
Simpson et al.

(10) Patent Number: US RE41,496 E
(45) Date of Reissued Patent: Aug. 10, 2010

(54) BOUNDARY-SCAN INPUT CIRCUIT FOR A RESET PIN

(76) Inventors: David L. Simpson, 2755 American Ave., West Columbia, SC (US) 29170; Thomas L. Langford, II, 5441 N. Delaware Ave., Wichita, KS (US) 67204

(21) Appl. No.: 11/594,221
(22) Filed: Nov. 8, 2006

Related U.S. Patent Documents

Reissue of:
(64) Patent No.: 5,260,950
Issued: Nov. 9, 1993
Appl. No.: 07/761,141
Filed: Sep. 17, 1991

(51) Int. Cl.
*G06F 11/00* (2006.01)

(52) U.S. Cl. ..... 714/727; 714/30; 714/733; 714/724; 324/73.1

(58) Field of Classification Search ..... 714/727
See application file for complete search history.

(56) References Cited

U.S. PATENT DOCUMENTS 4,038,648 A * 7/1977 Chesley ..... 365/201
4,222,514 A * 9/1980 Bass ..... 714/739
4,580,137 A * 4/1986 Fiedler et al. ..... 340/825.68
4,649,539 A * 3/1987 Crain et al. ..... 714/731
4,669,081 A * 5/1987 Mathewes et al. ..... 714/703
4,670,877 A * 6/1987 Nishibe ..... 714/728
4,740,970 A * 4/1988 Burrows et al. ..... 714/733
4,875,003 A * 10/1989 Burke ..... 714/736
4,904,883 A * 2/1990 Iino et al. ..... 327/198
4,912,709 A * 3/1990 Teske et al. ..... 714/724
4,922,492 A * 5/1990 Fasang et al. ..... 714/724
4,949,341 A * 8/1990 Lopez et al. ..... 714/736
4,979,172 A * 12/1990 Murase et al. ..... 714/27
5,084,874 A * 1/1992 Whetsel, Jr. ..... 714/727
5,115,435 A * 5/1992 Langford et al. ..... 714/727
5,149,987 A * 9/1992 Martin ..... 327/143
5,155,432 A * 10/1992 Mahoney ..... 324/763
5,199,035 A * 3/1993 Lopez et al. ..... 714/820
5,260,948 A * 11/1993 Simpson et al. ..... 714/727
5,291,425 A * 3/1994 Nagaishi ..... 716/4
5,325,368 A * 6/1994 James et al. ..... 714/727
5,379,302 A * 1/1995 Andrews ..... 714/727
5,392,296 A * 2/1995 Suzuki ..... 714/731
5,450,415 A * 9/1995 Kamada ..... 714/727
5,467,354 A * 11/1995 Yamauchi ..... 714/729
5,477,493 A * 12/1995 Danbayashi ..... 365/201
5,479,127 A * 12/1995 Bui ..... 327/174
5,568,437 A * 10/1996 Jamal ..... 365/201
5,592,493 A * 1/1997 Crouch et al. ..... 714/729
5,617,531 A * 4/1997 Crouch et al. ..... 714/30
5,732,091 A * 3/1998 Whetsel ..... 714/727
5,744,949 A * 4/1998 Whetsel ..... 324/158.1
5,774,476 A * 6/1998 Pressly et al. ..... 714/726
5,828,827 A * 10/1998 Mateja et al. ..... 714/30
5,875,153 A * 2/1999 Hii et al. ..... 365/233.1
5,889,788 A * 3/1999 Pressly et al. ..... 714/726
6,029,263 A * 2/2000 Gibson ..... 714/726
6,256,759 B1 * 7/2001 Bhawmik et al. ..... 714/726
6,523,135 B1 * 2/2003 Nakamura ..... 714/30
6,671,860 B2 * 12/2003 Langford, II ..... 716/2
6,779,143 B2 * 8/2004 Grisenthwaite ..... 714/727
6,954,886 B2 * 10/2005 Tu et al. ..... 714/726
6,981,191 B2 * 12/2005 Dorsey ..... 714/733
7,055,060 B2 * 5/2006 Nguyen et al. ..... 714/11
7,194,671 B2 * 3/2007 Tu et al. ..... 714/744
7,342,404 B2 * 3/2008 Schmid et al. ..... 324/763
2005/0120270 A1 * 6/2005 Anand et al. ..... 714/30

* cited by examiner

*Primary Examiner*—Christopher S McCarthy
(74) *Attorney, Agent, or Firm*—Sterne, Kessler, Goldstein & Fox P.L.L.C.

(57) ABSTRACT

A boundary-scan circuit method and apparatus for asserting an internal reset signal connected to core logic circuits of an electronic device in order to assure that testing will begin and end in a safe, known logic state. A safe end state is assured even if the system reset signal on an input pin of the electronic device is logically disconnected from the internal reset connection to the core logic, as often occurs in boundary-scan and related testing.

32 Claims, 1 Drawing Sheet

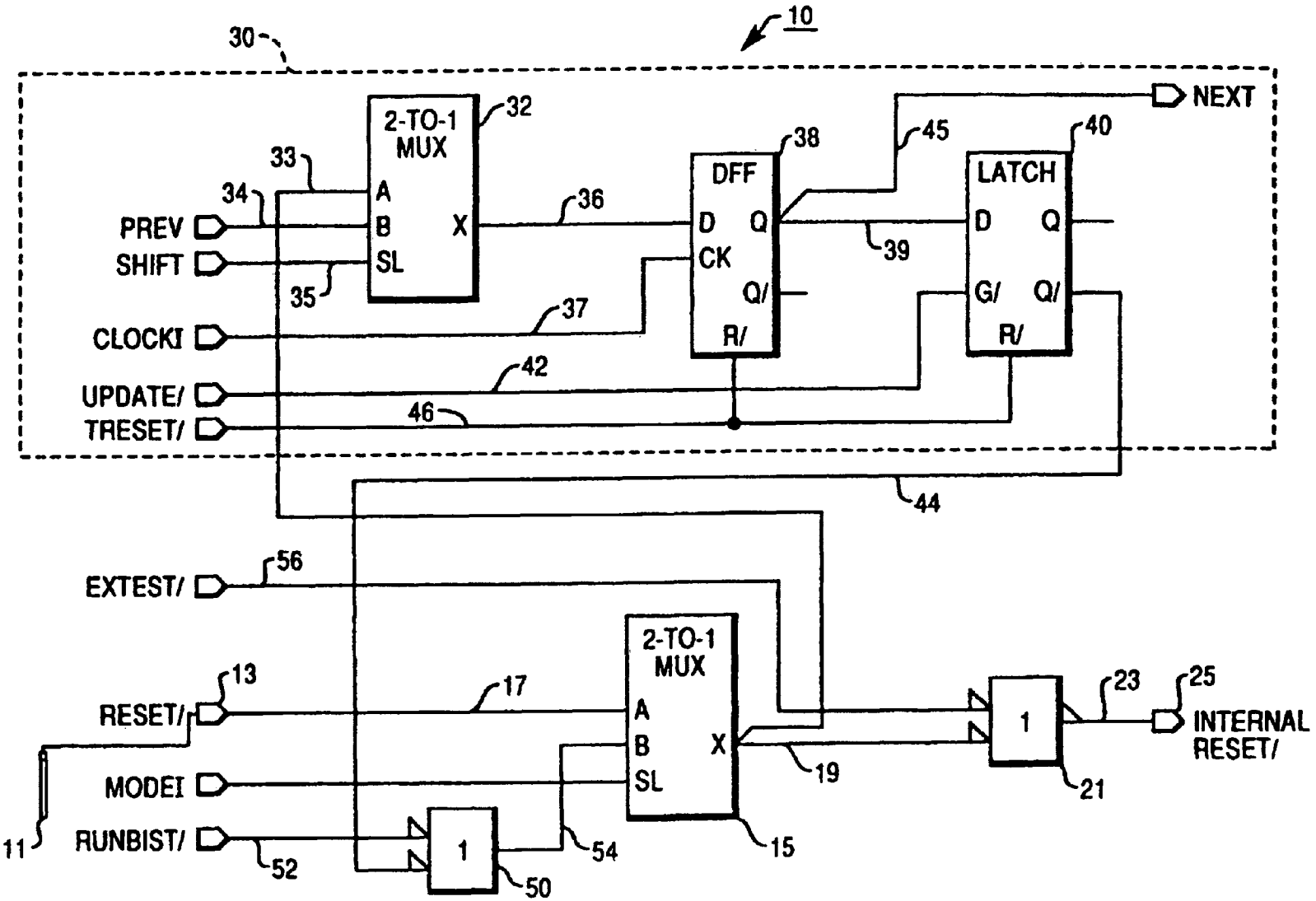
10
30
NEXT
LATCH
D
Q
G/
Q/
R/
40
DFF
D
CK
Q
Q/
R/
38
45
39
2-TO-1
MUX
A
B
SL
X
32
36
37
42
46
33
34
35
PREV
SHIFT
CLOCKI
UPDATE/
TRESET/
44
56
EXTEST/
1
21
23
25
INTERNAL
RESET/
2-TO-1
MUX
A
B
SL
X
15
19
17
13
RESET/
MODEI
54
1
50
52
RUNBIST/
11

BOUNDARY-SCAN INPUT CIRCUIT FOR A RESET PIN

Matter enclosed in heavy brackets [ ] appears in the original patent but forms no part of this reissue specification; matter printed in italics indicates the additions made by reissue.

BACKGROUND OF THE INVENTION

The present invention relates to a boundary-scan circuit of an electronic device, and more particularly to a boundary-scan circuit to provide a reset signal between a reset input pin and a core logic reset input to reset the core logic in preparation for or at the completion of testing of the electronic device.

The integrated circuit industry has adopted IEEE Std. 1149.1 (1990), which is hereby incorporated by reference, to provide a standard test architecture for their products. The intent of the IEEE Std. 1149.1 standard is to provide compatibility of test control and data signals between devices from different manufacturers in much the same way that compatibility presently exists within major logic family, e.g. TTL, CMOS, etc. This standard test architecture facilitates the development of standard tests and standard test development techniques that may be reused instead of recreated every time a new electronic device is produced.

Many integrated circuits have reset input pins that are connected to their respective system or sub-system reset signals. If this system or sub-system reset signal is asserted, the core logic of the integrated circuit is asynchronously induced to a reset state. The reset state usually means that all memory devices, e.g. flip-flops, DRAMs, counters, etc., have their internal states reset to logic low levels. This causes the non- inverted outputs, i.e. the Q outputs, also to be at logic low levels. Those skilled in the art will appreciate that other definitions of a reset state are possible as long as the electronic device always assumes that predetermined state after a reset signal has been asserted at its reset input.

During various tests that are permitted under IEEE 1149.1, such as, boundary-scan testing, external testing (EXTEST) and built-in-self-test (BIST) testing, a reset pin may be functionally disconnected from the core logic that it resets in normal operation. This happens frequently during boundary-scan EXTEST testing and BIST testing of the core logic of the electronic device. This is necessary in order to permit the system test circuitry to test various conductor continuities and to provide stimulation of the core logic through numerous internal logic states. The resulting logic state at the end of a test may not have any individual significance to the test circuit as long as it corresponds to a correct response to an essentially random input. The resulting logic state, however, may have a totally different significance when the electronic device transitions from a test mode to normal operation. A random state which is an appropriate response in a test mode, may be decoded in normal operation as a very inappropriate command or data output by the electronic device when a transition is made from test mode to normal operating mode. Thus, there is a need to provide an apparatus and a method for placing the electronic device into a safe internal logic state whenever any type of testing of core logic or external connections is completed.

Thus, it is an object of the present invention to provide a boundary-scan circuit reset input circuit that switches from a system reset signal to a test reset signal before any other test signals can be communicated to core logic circuits of the circuit under test.

It is another object of the present invention to provide a boundary-scan reset input circuit that resets the core logic of the circuit under test after the test is completed and before the boundary-scan reset input circuit switches from the test reset signal to a system reset signal.

It is a further object of the present invention to provide a method for providing a test reset signal that resets the circuit under test to a safe final state after the completion of testing.

SUMMARY OF THE INVENTION

According to one aspect of the invention, the foregoing objects are achieved by a circuit apparatus providing a reset signal to core logic of an electronic device. This circuit apparatus includes a storage device for storing a reset control signal. This storage device has an output for outputting the reset control signal. Connected to the output of the storage device is a device for logically combining the reset control signal and a BIST control signal into a reset and-BIST control signal, which is provided at an output thereof. Connected to the output of the logically combining device is a device for controllably switching either a first input that is connected to a system reset signal or a second input that is connected through to the output of the logically combining device. The controllably switching device switches one of the input signals to an output thereof under control of a normal-or-test signal that is connected to a control input of the logically combining device. The output of the controllably switching device is connected to the core logic an provides the aforementioned reset signal thereto.

According to another aspect of the invention, the foregoing objects of the invention are achieved by providing a method for resetting core logic circuits connected to a boundary-scan input circuit in an electronic device including the steps of asserting a reset signal that resets a boundary-scan register that has an inverted output that is thereby driven to a logic high level, inverting and logically summing said logic high level output from said boundary-scan register as one input and a BIST control signal as another input to provide a logic low level output, multiplexing said logic level low output from said inverting and summing step by means of a multiplexer to provide a logic low level output of said multiplexer, and inverting and logically summing said logic low level output from said multiplexer as one input and an external-test control signal as another input to provide an internal logic high level and inverting said internal logic high level to a logic low level for resetting core logic of said electronic device.

BRIEF DESCRIPTION OF THE DRAWINGS

While the specification concludes with the appended claims particularly pointing out and distinctly claiming the subject matter which is regarded as the invention, it is believed that the invention will be better understood from the following detailed description of the illustrative embodiment taken in conjunction with the accompanying drawings in which the FIGURE is a block diagram of a boundary-scan circuit for a reset pin.

DETAILED DESCRIPTION OF A PREFERRED EMBODIMENT

Referring to the FIGURE, there is shown a block diagram of a boundary-scan circuit 10 having a reset input pin 11 which is connected to a system reset signal (not shown). The system reset signal is typically an active low, which means that the reset signal is asserted when the reset signal is at a low logic level. A system reset signal that is an active high would require only minor modifications to the circuit 10. The pin 11 is connected to a reset input pad 13. This connection is made by the lead frame of the electronic device or some similar conductor.

The reset input pad is connected to one input of a 2-to-1 multiplexer 15 via line 17. The 2-to-1 multiplexer may be a type MUX2 as shown in NCR ASIC Data Book 1989, published by NCR Corporation, Dayton, Ohio.

The 2-to-1 multiplexer 15 selects, i.e. electronically switches, the system reset signal (RESET/) on line 17 when the circuit 10 is in the normal operating mode. This selection is controlled by a mode control signal (MODEI). When MODEI is not asserted, that is when it is at a logic low level, the 2-to-1 multiplexer 15 selects and switches the system reset signal through its internal logic devices to its output. On the other hand, when MODEI is asserted, the signal on its other input is selected and switched through internal logic devices to its output. This other input of the 2-to-1 multiplexer 15 is a logical combination of test reset signals, as will be described below.

The output of 2-to-1 multiplexer 15 is connected by line 19 to OR gate 21. The OR gate 21 has two inverting inputs and an inverted output. Thus, OR gate 15 takes each of its inputs, inverts them, takes a binary sum of the two inverted input signals to form a result and inverts this result to provide an output. With such a gate if either input is a logic low level, the inverted output will be a logic low level. The inverted output of OR gate 21 is connected by line 23 to reset input 25 of the core logic (not shown) of the integrated circuit which the boundary-scan circuit 10 is part of. Reset input 25 receives an active low reset control signal (INTERNAL RESET/) from OR gate 21 to reset the core logic circuits in either normal operation mode or test operation mode.

Boundary-scan reset input circuit 10, as its name implies, includes a boundary-scan register circuit 30. The Boundary-scan register circuit 30 includes a 2-to-1 multiplexer 32 that is the same type as the 2-to-1 multiplexer 15 described above. The 2-to-1 multiplexer 32 has one input connected by line 33 to the output signal of 2-to-1 multiplexer 15. The other input of 2-to-1 multiplexer 32 is connected by line 34 to an output from a previous boundary-scan register cell (not shown) in a serial boundary-scan chain similar to those shown in IEEE 1149.1. Which input is selected and switched to the output is controlled by a shift signal (SHIFT) on the select input of 2-to-1 multiplexer 32. The SHIFT signal is connected to the select input by line 35. When SHIFT is at a logic low level, the output of 2-to-1 multiplexer 15 is selected as the input of the boundary-scan circuit 30 that is switched to its output. On the other hand, when SHIFT is at a logic high level, the output of the previous boundary-scan register is selected as the input of the boundary-scan circuit 30 and switched to the output of 2-to-1 multiplexer 32. The output of 2-to-1 multiplexer 32 is connected by line 36 to a data input of type D flip-flop 38. The clock input of the type D flip-38 is connected to the boundary-scan test clock signal, CLOCKI, by line 37. CLOCKI is used to serially clock into type D flip-flop 38 data that is received on its data input and to store this received data within type D flip-flop 38. Thus, in boundary-scan chain mode, CLOCKI will sample and store data that is serially shifted in from a previous boundary-scan circuit, and when it is not in boundary-scan chain mode, CLOCKI will sample and store bits that correspond to the output data levels of 2-to-1 multiplexer 15. Each input that is clocked into type D flip-flop 38, will be outputted, after a brief predetermined delay, to the output thereof.

The non-inverted output of type D flip-flop 38 is connected to a data input of a latch 40 by line 39. Latch 40 is a type LATRP as shown in NCR ASIC Data Book 1989, published by NCR Corporation of Dayton, Ohio. The latch 40 has an active low gating input (G/) that is connected by line 42 to a boundary-scan circuit test control signal (UPDATE/). When UPDATE/ is asserted, the output logic level of the type D flip-flop 38 is stored into latch 40. An inverted output of latch 40 is connected by line 44 to an OR gate 50 which will be explained below. The non-inverted output of type D flip-flop 38 is also connected by line 45 to a next boundary-scan register circuit (not shown) to form a boundary-scan test chain similar to the ones shown in IEEE 1149.1.

Type D flip-flop 38 and latch 40 each have an asynchronous reset input (R/) that is connected by conductor 46 to an asynchronous test reset control signal (TRESET/). TRESET/ is an active low which may be asserted at anytime and if it is asserted, all of the reset-table devices it is connected to will assume the reset state. Specifically, if TRESET/ is asserted, latch 40 will assume a reset state. In a reset state, the inverted output of latch 40 will be at a logic high level, the use of which will be explained below.

OR gate 50 has two inverting inputs. One of these inverting inputs is connected by line 44 to the inverted output of latch 40. The other inverting input is connected by line 52 to a run BIST control signal (RUN-BIST/), which is an active low control signal. The output of OR gate 50 is connected by line 54 to the other input of 2-to-1 multiplexer 15. This input is selected if the MODEI signal is a logic high, which is the MODEI signal for a test mode. Thus, when MODEI is at a logic high level, the signal at the output of 0R gate 50 is switched by 2-to-1 multiplexer 15 to its output, transferred by line 19 to OR gate 21. In such a case, if the output of OR gate 50 is a logic low level, then the output of OR gate 21 will be a logic low level and the core logic will be asynchronously reset.

The boundary-scan reset input circuit 10 also connects to an external test reset control signal (EXTEST/) by line 56 to a second inverting input of OR gate 21. The operation of boundary-scan reset input circuit 10 in response to an asserted EXTEST/ signal is explained below.

OPERATION OF THE PREFERRED EMBODIMENT

In normal operation, EXTEST/ is not asserted and MODEI is not asserted. With these conditions, RESET/ is received on pin 11, switched through 2-to-1 multiplexer 15 and propagates through OR gate 21 to provide signal INTERNAL RESET/ which either resets or does not reset the core logic of the integrated circuit that the boundary-scan reset input circuit 10 is a part of.

In external-test operation, the core logic is exercised by means of boundary-scan circuits (not shown) to induce the outputs and inputs being tested to transmit and receive data from external circuitry (not shown). The test data inputs and outputs used in an external-test may leave the core logic in an undesirable or even hazardous logic condition. To prevent undesirable and hazardous results upon a return to normal operation after an external-test operation, EXTEST/ is asserted to a logic low level as any external-test is ending. This logic low level propagates through OR gate 21 to provide a logic low level as the active low signal INTERNAL RESET/, which causes the core logic to be reset.

For a BIST test operation, EXTEST/ is not asserted so it has no influence during BIST testing. TRESET/, on the other hand is asserted before the start of a BIST test to reset latch 40 to a logic low internal storage state. In the reset state, the inverted output of latch 40 will be a logic high level. BIST control signal RUNBIST/ remains negated, i.e. is at a logic high level, at this time by an external control signal. OR gate 50 with logic high levels inputted on lines 44 and 52 will invert these levels to logic low levels and 0R them to result in a logic low level output on line 54 to 2-to-1 multiplexer 15. Next, MODEI changes to a logic high level which causes the output of OR gate 50 to be switched through 2-to-1 multiplexer 15 to OR gate 21. The logic low level from OR gate 50 will be inverted twice as it propagates through OR gate 21 and result in a logic low level outputted as the reset signal INTERNAL RESET/ of the core logic circuit. This logic low level causes the core logic to be reset at the beginning of each BIST test.

After the core logic has been reset, then the BIST control signal RUNBIST/ is asserted, i.e. driven by a logic low level by some external signal. This logic low level is inverted by the input of the OR gate 50 to a logic high level and this logic high provides a logic high level output from OR gate 50 to the 2-to-1 multiplexer 15. The 2-to-1 multiplexer 15 still has the output of OR gate 50 switched to its output, so this logic high level is outputted to line 19 by which it is inputted to OR gate 21. Assuming that EXTEST/ is not asserted, this logic high level will propagate through the OR gate 21 and cause the INTERNAL RESET/ core logic reset signal to be at a logic high level. With INTERNAL RESET/ at a high logic level, the BIST test may run without any danger of being asynchronously reset.

At the completion of the BIST test, RUNBIST/ is asserted, i.e. driven to a logic high level. OR gate 50 with a logic high inputted on line 52 and a logic high still inputted on line 44 causes its output to 2-to-1 multiplexer 15 to be a logic low level. As previously described, this logic low level will propagate through OR gate 21 and reset the core logic again. Next the MODEI signal is negated and the 2-to-1 multiplexer switches control of the reset function to normal system operation. Thus, the core logic is reset at the start of each BIST test and reset at the completion of each BIST test, but before normal operation.

Additionally, boundary-scan register circuit 30 provides access for scan chain serially shifted data to an input of OR gate 50 to provide a reset signal. Then this serial scan path provides access for typical IEEE 1149.1 boundary scan test signals. Further, line 33 from the output to 2-to-1 multiplexer 15 to an input of 2-to-1 multiplexer 32 provides access for data samples from the reset path to any boundary-scan chain that boundary-scan test register circuit 30 is a part of.

It will now be understood that there has been disclosed a boundary-scan input circuit for a system reset pin which provides a means for resetting the core logic to a safe state at the completion of testing even if the system reset input has been logically disconnected from its input pin as part of a boundary-scan or other IEEE 1149.1 test. While the invention has been particularly illustrated and described with reference to a preferred embodiment thereof, it will be understood by those skilled in the art that various changes in form, details, and applications may be made therein, such as changes from positive logic gates to negative logic gates by the application of Boolean algebra. It is accordingly intended that the appended claims shall cover all such changes in form, details and applications which do not depart from the true spirit and scope of the invention.

What is claimed as new and desired to be secured by Letters Patent of the United States is:

1. A circuit apparatus providing a reset signal to core logic of an electronic device, said circuit apparatus comprising:

storage means for storing and outputting a reset control signal;

means for logically combining said reset control signal and a *built-in-self-test* (BIST) control signal into a reset-and-BIST control signal at an output thereof; and means for controllably switching either a first input that [is connected to] *receives* a system reset signal or a second input that is connected to said output of said logically combining means to an output [thereof] *of said switching means* under control of a normal-or-test signal that is [connected] *propagated* to a control input of said logically combining means; and said output of said [controllably] switching means is connected to said core logic and provides said reset signal.

2. A circuit apparatus providing a reset signal to core logic of an electronic device, according to claim 1, wherein said storage means is a transparent latch.

3. A circuit apparatus providing a reset signal to core logic of an electronic device, according to claim 2, wherein said logically combining means is an OR gate having a plurality of inverting inputs and a non-inverting output.

4. A circuit apparatus providing a reset signal to core logic of an electronic device, according to claim 3, wherein said controllably switching means is a 2-to-1 multiplexer.

5. A circuit apparatus providing a reset signal to core logic of an electronic device, according to claim 4, wherein said transparent latch is resettable.

6. A circuit apparatus providing a reset signal to core logic of an electronic device, according to claim 5, wherein [said] *an* output of said transparent latch is an inverting output.

7. A circuit apparatus providing a reset signal to core logic of an electronic device, according to claim 1, further comprising second means for logically combining said reset signal output from said output of said controllably switching means and an external test control signal.

8. A circuit apparatus providing a reset signal to core logic of an electronic device, according to claim 7, wherein said second logically combining means is an OR gate, said OR gate having a plurality of inverting inputs and an inverted output.

9. An input circuit connected to a reset pin of [a] *an* electronic device, comprising:

boundary-scan register means for storing a boundary-scan test information bit;

said boundary-scan register means having an inverted output of the logic level stored therein;

a logical sum means for taking a logical sum of a first inverting input that is connected to said boundary-scan register means inverted output and a second inverting input that [is connected to] *receives* a *built-in-self-test* (BIST) control signal and providing a result at an output thereof;

a first 2-to-1 multiplexer having one data input connected to said output of said logical sum means, another data input connected to [the] *an input* reset pin, a select input connected to a normal/test pin, and an output that is multiplexed to one of said data inputs under the control of a select signal upon said [select] *normal/test* pin;

a second logical sum means having a first inverting input connected to said first 2-to-1 multiplexer output and a second inverting input connected through an inverter to an external-test control signal, *wherein* said second logical sum means is for taking a logical sum of the inverses of the logic signals on [it] *its* two inputs and inverting the logic sum thereof to provide a reset signal to core logic connected at an output of said second logical sum means;

whereby if said external-test control signal is at a logic low level, said reset signal to said core logic is active such that said core logic is held reset as long as said external test control signal is [not] at a *logic level other than said* logic low level.

10. An input circuit connected to [a system reset signal] *a reset pin* of an electronic device as set forth in claim 9, further comprising:

a second 2-to-1 multiplexer included as part of said boundary-scan register means having one of its data inputs connected to a serial data input, its other data input connected to said output of said first 2-to-1 multiplexer and a select input connected to a shift select control signal whereby said shift control signal selects either the serial data input signal or the output signal of the first 2-to-1 multiplexer as a logic level to be stored in said boundary-scan register means.

11. An input circuit connected to [a system reset signal] *a reset pin* of a electronic device as set forth in claim 9, wherein if said output of said first 2-to-1 multiplexer is at a logic low level, said reset signal to said core logic is active such that said core logic is held reset as long as said first 2-to-1 multiplexer output is at a logic low level.

12. An input circuit connected to [a system reset signal] *a reset pin* of an electronic device as set forth in claim 11 wherein said boundary-scan register means has an asynchronous reset input that causes said inverted output of said boundary-scan register means to be a logic high signal if said asynchronous input is driven to a logic low level.

13. An input circuit connected to [a system reset signal] *a reset pin* of an electronic device as set forth in claim 9, wherein said boundary-scan register means includes a type D flip-flop and a latch with a data input of said latch being connected to a non-inverted output of said type D flip-flop.

14. An input circuit connected to [a system reset signal] *a reset pin* of an electronic device as set forth in claim 9, wherein said first logical sum means is an OR gate having inverting inputs and said second logical sum means is an OR gate having inverting inputs and an inverted output.

15. A method for resetting core logic circuits connected to a boundary-scan input circuit in an electronic device comprising the steps of:

asserting a reset signal that resets a boundary-scan register that has an inverted output that is thereby driven to a logic high level;

inverting and logically summing said logic high level output from said boundary-scan register as one input and a *built-in-self-test* (BIST) control signal as another input to provide a logic low level output;

multiplexing said logic level low output from said inverting and summing step by means of a multiplexer to provide a logic low level output of said multiplexer; and inverting and logically summing said logic low level output from said multiplexer as one input and an external test control signal as another input to provide an internal logic high level and inverting said internal logic high level to a logic low level for resetting core logic of said electronic device.

16. A method for resetting core logic circuits connected to boundary-scan input circuit in an electronic device according to claim 15 further comprising the steps of:

asserting the reset signal that resets a boundary-scan register that has an inverted output that is thereby driven to a logic high level;

negating the BIST control signal if a BIST test is completed;

inverting and logically summing said logic high level output from said boundary-scan register as one input and a BIST control signal as another input to provide a logic low level output;

multiplexing said logic level low output from said inverting and summing step by means of a multiplexer to provide a logic low level output of said multiplexer;

inverting and logically summing said logic low level output from said multiplexer as one input and an external test control signal as another input to provide an internal logic high level and inverting said internal logic high level to a logic low level for resetting core logic of said electronic device; and multiplexing a logic level from a system reset pin of the electronic device to resume normal operation after said BIST test is completed.

*17. An electronic device, comprising:*

*a circuit apparatus providing a reset signal to core logic of the electronic device, said circuit apparatus comprising:*

*storage means for storing and outputting a reset control signal;*

*means for logically combining said reset control signal and a built-in-self-test (BIST) control signal into a reset-and-BIST control signal at an output thereof; and*

*means for controllably switching either a first input that receives a system reset signal or a second input that is connected to said output of said logically combining means to an output of said switching means under control of a normal-or-test signal that is propagated to a control input of said logically combining means; and*

*said output of said switching means is connected to said core logic and provides said reset signal.*

*18. An electronic device, comprising:*

*an input circuit connected to a reset pin of the electronic device, comprising:*

*boundary-scan register means for storing a boundary-scan test information bit;*

*said boundary-scan register means having an inverted output of the logic level stored therein;*

*a logical sum means for taking a logical sum of a first inverting input that is connected to said boundary-scan register means inverted output and a second inverting input that is connected to receive a built-in-self-test (BIST) control signal and providing a result at an output thereof;*

*a first 2-to-1 multiplexer having one data input connected to said output of said logical sum means, another data input connected to the reset pin, a select input connected to a normal/test pin, and an output that is multiplexed to one of said data inputs under the control of a select signal upon said select pin; and*

*a second logical sum means having a first inverting input connected to said first 2-to-1 multiplexer output and a second inverting input connected through an inverter to receive an external-test control signal, wherein said second logical sum means is for taking a logical sum of the inverse of the logic signals on its two inputs and inverting the logic sum thereof to provide a reset signal to core logic connected at an output of said second logical sum means;*

*whereby if said external-test control signal is at a logic low level, said reset signal to said core logic is active such that said core logic is held reset as long as said external test control signal is not at a logic low level.*

*19. A circuit apparatus providing a reset signal to core logic of an electronic device, the circuit apparatus comprising:*

*storage means for storing and outputting a reset control signal;*

*means for logically combining the reset control signal and a built-in-self-test (BIST) control signal into a reset-and-BIST control signal at an output thereof; and*

*means for controllably switching either a first input that receives a system reset signal or the output of the combining means or a second input that is connected to the output of the combining means to an output of the switching means under the control of a normal-or-test signal that is propagated to a control input of the logically combining means; and*

*wherein the output of the switching means is connected to the core logic and provides the reset signal.*

*20. The circuit apparatus of claim 19, wherein the storage means is a transparent latch.*

*21. The circuit apparatus of claim 20, wherein the combining means is an OR gate having a plurality of inverting inputs and a non-inverting output.*

*22. The circuit apparatus of claim 21, wherein the switching means is a 2-to-1 multiplexer.*

*23. The circuit apparatus of claim 22, wherein the transparent latch is resettable.*

*24. The circuit apparatus of claim 23, wherein an output of the transparent latch is an inverting output.*

*25. The circuit apparatus of claim 19, further comprising second means for combining the reset signal output from the output of the switching means and an external test control signal.*

*26. The circuit apparatus of claim 25, wherein the second logically combining means is an OR gate, and wherein the OR gate has a plurality of inverting inputs and an inverted output.*

*27. An input circuit connected to a reset pin of an electronic device, comprising:*

*boundary-scan register means for storing a boundary-scan test information bit, wherein the boundary-scan register means has an inverted output of the logic level stored therein;*

*a first logical sum means for taking a logical sum of a first inverting input connected to the inverted output of the boundary-scan register means and a second inverting input that receives a built-in-self-test (BIST) control signal and providing a result at an output thereof;*

*a first 2-to-1 multiplexer having one data input connected to the output of the first logical sum means, another data input connected to an input reset pin, a select input connected to a normal/test pin and configured to receive a normal/test signal, and an output that is multiplexed to one of the data inputs under the control of the normal/test signal;*

*a second logical sum means having a first inverting input connected to the first 2-to-1 multiplexer output and a second inverting input connected through an inverter to an external-test control signal, wherein the second logical sum means takes a logical sum of the inverses of the logic signals on its two inputs and inverts the logic sum thereof to output a reset signal to core logic connected to an output of the second logical sum means;*

*wherein when the external-test control signal is at a logic low level, the outputted reset signal to the core logic is active such that the core logic is held reset as long as the external test control signal is at a logic level other than the logic low level.*

*28. The input circuit of claim 27, further comprising a second 2-to-1 multiplexer, included as part of the boundary-scan register means, having one data input connected to a serial data input, another data input connected to the output of the first 2-to-1 multiplexer, and a select input that receives a shift select control signal, wherein the shift control signal selects either the serial data input signal or the output signal of the first 2-to-1 multiplexer as a logic level to be stored in the boundary-scan register means.*

*29. The input circuit of claim 27, wherein when the output of the first 2-to-1 multiplexer is at a logic low level, the outputted reset signal is active such that said core logic is held reset as long as the first 2-to-1 multiplexer output is at a logic low level.*

*30. The input circuit of claim 29, wherein the boundary-scan register means has an asynchronous reset input that causes the inverted output of the boundary-scan register means to be a logic high signal when the asynchronous input is driven to a logic low level.*

*31. The input circuit of claim 27, wherein the boundary-scan register means includes a type D flip-flop and a latch, and wherein a data input of the latch is connected to a non-inverted output of the type D flip-flop.*

*32. The input circuit of claim 27, wherein the first logical sum means is an OR gate having inverting inputs and the second logical sum means is an OR gate having inverting inputs and an inverted output.*

* * * * *

UNITED STATES PATENT AND TRADEMARK OFFICE

CERTIFICATE OF CORRECTION

PATENT NO. : RE41,496 E
APPLICATION NO. : 11/594221
DATED : August 10, 2010
INVENTOR(S) : Simpson et al.

It is certified that error appears in the above-identified patent and that said Letters Patent is hereby corrected as shown below:

Column 8, line 56, “inverse” should be replaced with --inverses--.

Signed and Sealed this
Twenty-ninth Day of March, 2011

David J. Kappos

David J. Kappos
*Director of the United States Patent and Trademark Office*